(12) United States Patent
Marin et al.

(10) Patent No.: US 8,907,506 B2
(45) Date of Patent: Dec. 9, 2014

(54) MULTIMODAL VIBRATION HARVESTER COMBINING INDUCTIVE AND MAGNETOSTRICTIVE MECHANISMS

(71) Applicant: Virginia Tech Intellectual Properties, Inc., Blacksburg, VA (US)

(72) Inventors: Anthony Marin, Blacksburg, VA (US); Shashank Priya, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 13/757,076

(22) Filed: Feb. 1, 2013

(65) Prior Publication Data

US 2013/0193693 A1     Aug. 1, 2013

Related U.S. Application Data

(60) Provisional application No. 61/593,640, filed on Feb. 1, 2012.

(51) Int. Cl.
*H02K 35/02* (2006.01)
*F03G 7/08* (2006.01)
*H01L 41/12* (2006.01)
*H02N 2/18* (2006.01)

(52) U.S. Cl.
CPC ............ *H01L 41/125* (2013.01); *F03G 7/08* (2013.01); *H02N 2/186* (2013.01); *H02K 35/02* (2013.01)
USPC .............................. 290/1 R; 310/26; 310/339

(58) Field of Classification Search
CPC ..................... F15B 15/2815; H02K 21/044
USPC ........................................................ 290/1 R
See application file for complete search history.

(56) References Cited

U.S. PATENT DOCUMENTS

| | | | |
|---|---|---|---|
| 6,998,999 B2* | 2/2006 | Fripp et al. | 340/854.4 |
| 2006/0049717 A1* | 3/2006 | Liebenow | 310/318 |
| 2011/0074162 A1* | 3/2011 | Cottone et al. | 290/1 R |
| 2011/0140577 A1* | 6/2011 | Galchev et al. | 310/339 |

(Continued)

OTHER PUBLICATIONS

Berbyuk V. (2011). Optimal Design of Magnetostrictive Transducers for Power Harvesting From Vibrations. Structural Dynamics and Renewable Energy, vol. 1. T. Proulx, Springer New York. 10: 199-210.

(Continued)

*Primary Examiner* — Michael Zarroli
(74) *Attorney, Agent, or Firm* — New River Valley IP Law, PC; Michele L. Mayberry

(57) ABSTRACT

Multi-Mechanism Energy Harvesters (MMEHs) combining magnetostrictive and inductive mechanisms with a shape and size similar to an AA battery. Included are MMEHs with (a) an inductive mode: a cylindrical tube, a rod lengthwise within the tube, permanent magnets with opposing polarities at opposing ends of the tube, an annular oscillatory magnet in the tube and between the magnets and around the rod; and a primary coil around the tube and oscillatory magnet, such that relative movement between the magnet and coil induces electrical current in the coil; and (b) a magnetostrictive mode comprising: piezoelectric cymbal transducers on opposing ends of the tube and comprising a magnetostrictive material surrounded by a secondary coil, such that movement of the magnetostrictive material induces voltage in the secondary coil. During use, electrical energy can be harvested from the relative motion between the magnet and coil and from the magnetostrictive material.

11 Claims, 11 Drawing Sheets

(56) References Cited

U.S. PATENT DOCUMENTS

| | | | |
|---|---|---|---|
| 2011/0187207 A1* | 8/2011 | Arnold et al. | 310/11 |
| 2013/0033130 A1* | 2/2013 | Nair et al. | 310/26 |
| 2013/0161957 A1* | 6/2013 | Bhat et al. | 290/53 |
| 2014/0028027 A1* | 1/2014 | Rastegar et al. | 290/53 |

OTHER PUBLICATIONS

Berbyuk V. and Sodhani J. (2008). "Towards modelling and design of magnetostrictive electric generators." Computers and Structures 86(3-5): 307-313.

Bonisoli E, Canova A, Freschi F, Moos S, Repetto M, Tornincasa S. (2010). "Dynamic Simulation of an Electromechanical Energy Scavenging Device." Magnetics, IEEE Transactions on 46(8): 2856-2859.

Constantinou P, Mellor PH, and Wilcox P. (2007). A Model of a Magnetically Sprung Vibration Generator for Power Harvesting Applications. Electric Machines & Drives Conference, 2007. IEMDC '07. IEEE International.

Dallago E, Marchesi M, and Venchi G. (2010). "Analytical Model of a Vibrating Electromagnetic Harvester Considering Nonlinear Effects." Power Electronics, IEEE Transactions on 25(8): 1989-1997.

Galchev, T., K. Hanseup, et al. (2011). "Micro Power Generator for Harvesting Low-Frequency and Nonperiodic Vibrations." Microelectromechanical Systems, Journal of 20(4): 852-866.

Lundgren A, Tiberg H, Kvarnsjo L and Bergqvist A: A magnetostrictive Electric Generator. IEEE Trans Magn. 1993; 29 (6): 3150-3152.

Mann, B. P. and N. D. Sims: Energy harvesting from the nonlinear oscillations of magnetic levitation. Journal of Sound and Vibration 2009; 319: 515-530.

Marin A, and Priya S. (2012). "Multi-mechanism vibration harvester combining inductive and piezoelectric mechanisms." Proceedings of SPIE, the international society for optical engineering 8341: 83411L-83411L-83411.

Saha CR, O'Donnell T, Wang N, McCloskey P: Electromagnetic generator for harvesting energy from human motion. Sens Actuators A. 2008; 147: 248-253.

Zhao X and Lord DG: Application of the Villari effect to electric power harvesting. J Appl Phys. 2006; 99 08M703.

* cited by examiner

FORCE AS A FUNCTION OF CENTER MAGNET COMPOSITE DISPLACEMENT AS PREDICTED BY ANSYS

MAGNETIC FIELD STRENGTH IN THE RADIAL DIRECTION WITHIN THE COIL VOLUME.

Voltage vs. Frequency for 0.4 G base acceleration.

Power vs. Frequency for 0.4 G base acceleration.

Voltage vs. Frequency for 0.7 G base acceleration.

Power vs. Frequency for 0.7 G base acceleration.

Voltage vs. Frequency for 0.9 G base acceleration.

Power vs. Frequency for 0.9 G base acceleration.

Frequency response function for 1 G base excitation.

MULTIMODAL VIBRATION HARVESTER COMBINING INDUCTIVE AND MAGNETOSTRICTIVE MECHANISMS

CROSS-REFERENCE TO RELATED APPLICATIONS

This application relies on the disclosure of and claims priority to and the benefit of the filing date of U.S. Provisional Application No. 61/593,640, filed on Feb. 1, 2012, the disclosure of which is hereby incorporated by reference herein in its entirety.

STATEMENT OF GOVERNMENT INTEREST

This invention was made with government support under Grant No. IIP-1035042 awarded by National Science Foundation. The government has certain rights in the invention.

BACKGROUND OF THE INVENTION

1. Field of the Invention

The present invention relates to the field of energy harvesting. More particularly, embodiments of the present invention relate to devices comprising at least two modes of energy harvesting, such as inductive and magnetostrictive mechanisms. Specific embodiments of the invention provide devices useful in structural health monitoring systems and other sensor technologies typically deployed on structures with limited accessibility and allow for wireless and/or remote monitoring.

2. Description of Related Art

Condition based health monitoring systems find application on a wide spectrum of platforms including railways, trucks, bridges, and ships. The three stages of condition-based maintenance (CBM) are diagnostics, prognostics, and maintenance scheduling. The diagnostics involves real time fault monitoring and diagnosis, background studies, and fault analysis.

One systems approach to the design of CBM includes failure identification and its criticality, failure analysis and decision making, failure classification, prediction of failure evolution, scheduling of required maintenance, and collaboration with the logistics. See G. Vachtsevanos, F. L. Lewis, M. Roemer, A. Hess, and B. Wu, "Intelligent Fault Diagnosis and Prognosis for Engineering Systems" (2006); see also G. Vachtsevanos, F. Rufus, J. V. R. Prasad, I. Yavrucuk, D. Schrage, B. Heck, and L. Wills, Software Enabled Control: Information Technologies for Dynamical Systems, pp. 225-252 (2005).

The pre-stage of diagnostics involves machine sensors, data collection and data transfer for further processing. Many of these components used in diagnostics are currently battery powered which increases the operation cost and adds additional complexity. With increasing demand for wireless sensor nodes in automobile, aircraft and rail applications, the need for energy harvesters has been growing. In these applications, energy harvesters provide a more robust and inexpensive power solution than batteries. Thus, energy harvesting has emerged as an effective way to either reduce the number of batteries or increase their lifetime. As is the case with any battery-powered device, existing battery powered sensor systems typically have a battery housing for accommodating a limited number and type of batteries. Due to size constraints, sensor systems disposed in remote locations and/or on remote structures or vehicles are typically installed on surfaces where it is not possible to accommodate an additional energy harvester module. Accordingly, it is desired to provide multimodal vibration energy harvesters that have a similar form factor as that of a battery which makes integration easier with existing electronic components. In this manner, the energy harvester may be integrated into the existing battery housing thereby replacing one or more batteries, or an additional energy harvester structure about the same size as the existing battery housing may be mounted in the vicinity without being too bulky.

The dominant vibration magnitudes available within railways, trucks, bridges, and ships typically exist at frequencies below 20 Hz. Within this frequency range the vibration frequency can fluctuate requiring the capability to harvest at a broadband of frequencies. Thus, it would be desired to develop a low frequency and broadband vibration energy harvester.

In vibration energy harvesting, there are predominately two types of harvesters, namely, cantilever beam and magnetic levitation based designs. Cantilever beam based harvesters typically optimally operate at frequencies greater than 50 Hz. The difference in frequency range between the two harvester types is due to stiffness magnitude control. The stiffness created by repulsive magnets in a magnetic levitation system can be decreased by decreasing the strength of the outer magnets or distance between top and bottom magnets, whereas cantilever beam stiffness is determined by the beam geometry. Cantilever beam stiffness cannot be decreased to the lower levels achieved by magnetic levitation harvesters without sacrificing the structural integrity of the beam or by increasing the cantilever length increasing the size of the harvester to impractical levels. Another advantage inherent to the magnetic levitation systems is a non-linear stiffness profile. This is due to the repulsive force between magnetic poles increasing by the square of the distance between them. The non-linear stiffness profile causes magnetic levitation harvesters to have a non-linear frequency response which allows for harvesting more power within a broad range of frequencies as compared to linear frequency response.

In order to enhance the power density of existing energy harvesters, a variety of multimodal energy harvesting techniques have been proposed. Generally, multi-modal energy harvesters can be categorized as: (i) Multi-Source Energy Harvester (MSEH), (ii) Multi-Mechanism Energy Harvester (MMEH), and (iii) Single Source Multi-Mode Energy Harvester ($S^2M^2EH$). Particularly desired are multimodal energy harvesting devices with magnetic levitation and magnetostrictive capabilities.

SUMMARY OF THE INVENTION

Multi-Mechanism Energy Harvester (MMEH) devices with inductive and piezoelectric (e.g., magnetostrictive) mechanisms are provided by embodiments of the present invention. In preferred embodiments, multi-modal devices are provided within a package similar to the shape and size of an AA battery. Multi-modal devices of the present invention can also be scaled up to meet the requirements of additional applications, however, highly desired are energy harvesters having a form factor similar to that of an AA battery. For example, constraining the device to the size and shape of an AA battery enables replacement of one or more batteries within an existing battery housing, or otherwise limits the amount of space needed to accommodate an energy harvester module in addition to the battery housing.

A first mode or feature of embodiments of the invention is an inductive mechanism. In embodiments, the inductive mechanism comprises coil wrapped around a cylindrical cavity through which a levitating magnet oscillates. During use and when the device is subjected to an external source of vibration, the levitating permanent magnet moves within the cavity and induces current in the coil. One way to create the magnetic levitation involves disposing stationary magnets with opposite poles at opposing ends (i.e., the top and bottom) of the cylindrical cavity.

A second mode or feature of embodiments of the invention is a magnetostriction mechanism, which capitalizes on the construction of the magnetic levitation cavity. In embodiments, the magnetostrictive mechanism consists of two clamped vibrating Galfenol discs at the top and bottom of the harvester. Ideally, the magnetostrictive discs are disposed at opposing ends of the cylindrical cavity. In embodiments, the magnetostrictive mechanism is made of Galfenol, which is preferred over Terfenol-D, to keep cost at a minimum. Such devices with this dual method of energy harvesting are expected to lead to higher power densities by increasing the volumetric efficiency.

Specific objects of the invention include Object 1, which is a multimodal energy harvester comprising: (a) an inductive mode comprising: a cylindrical tube with opposing ends, a rod disposed lengthwise within the tube, a first permanent magnet with a first polarity disposed at one end of the cylindrical tube and a second permanent magnet with a second polarity opposite the first polarity disposed at the opposing end of the cylindrical tube, a central, annular oscillatory magnet disposed within the tube, between the first and second permanent magnets, and around the rod; and a primary coil disposed around an exterior of the cylindrical tube and surrounding a portion of the central magnet, such that during use relative movement between the oscillatory magnet and the primary coil induces an electrical current in the primary coil; and (b) at least one magnetostrictive mode comprising: a piezoelectric cymbal transducer disposed on one end of the cylindrical tube and comprising a magnetostrictive material surrounded by a secondary coil, such that during use movement of the magnetostrictive material induces voltage in the secondary coil.

Object 2 is an energy harvester of Object 1, which is sized and shaped similar to that of an AA battery.

Object 3 includes such energy harvesters of Objects 1 and 2, which further comprise a protective housing configured to enclose the inductive and magnetostrictive modes.

Object 4 is an energy harvester of any of Objects 1-3, wherein the oscillatory magnet is a single oscillating magnet.

Object 5 is an energy harvester of any of Objects 1-4, wherein the oscillatory magnet is a composite of two magnets with opposite poles separated by a magnetic metal.

Object 6 is an energy harvester of any of Objects 1-5, wherein during use the relative movement between the oscillatory magnet and the primary coil is caused by movement of the magnet.

Object 7 is an energy harvester of any of Objects 1-6, wherein the magnetostrictive material is in a pre-stressed state.

Object 8 is an energy harvester of any of Objects 1-7, wherein the magnetostrictive material is chosen from Galfenol (FeGa Alloy), Terfenol-D ($Tb_xDy_{1-x}Fe_2$), NCZF (nickel-copper-zinc ferrite), and Metglas (iron-nickel-phosphorus-boron alloy). Galfenol is understood to refer to any Fe—Ga alloy (See Atulasimha, Characterization and modeling of the magnetomechanical behavior of iron-gallium alloys, 2006). Terfenol-D is understood to refer to any terbium, dysprosium, iron alloy, especially alloys with a composition of $Tb_xDy_{1-x}Fe_2$ (See Wang & Jin, Magnetization and magnetostriction of Terfenol-D near spin reorientation boundary, Journal of Applied Physics, 2012). NCZF is understood to refer to Ni—Cu—Zn ferrite (See Ling et al., Electromagnetic properties of ferroelectric/ferromagnetic composite materials base on low temperature cofired ceramic technology, Journal of Applied Physics, 2009). Metglas is understood to refer to amorphous metal alloys, including Fe—Ni—P—B alloys.

Object 9 is an energy harvester of any of Objects 1-8, wherein the magnetostrictive mode comprises two piezoelectric cymbal transducers disposed at opposing ends of the cylindrical tube.

Object 10 is an energy harvester of any of Objects 1-9, wherein the primary and secondary coils comprise copper wire.

Object 11 is an energy harvester of Objects 1-10, which is a low frequency and broadband vibration energy harvester capable of harvesting energy from frequencies below about 20 Hz.

BRIEF DESCRIPTION OF THE DRAWINGS

The accompanying drawings illustrate certain aspects of some embodiments of the present invention, and should not be used to limit or define the invention. Together with the written description the drawings serve to explain certain principles of the invention.

DETAILED DESCRIPTION OF VARIOUS EMBODIMENTS OF THE INVENTION

Reference will now be made in detail to various exemplary embodiments of the invention. It is to be understood that the following discussion of exemplary embodiments is not intended as a limitation on the invention. Rather, the following discussion is provided to give the reader a more detailed understanding of certain aspects and features of the invention.

Figure 1:
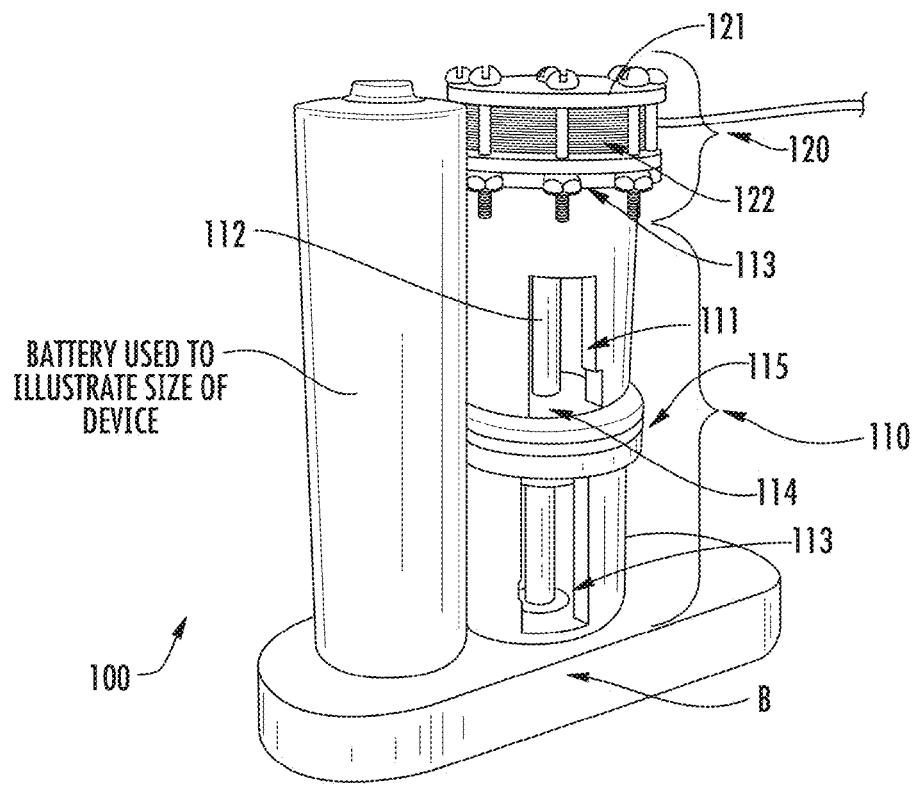
FIG. 1 is a schematic diagram showing an embodiment of an energy harvester of the present invention.

A CAD model of a representative multimodal energy harvester according to embodiments of the invention is shown in FIG. 1. As shown, the device preferably includes an outer housing (not shown) to cover a primary coil (PC) 101 and two secondary coils (SC), an inner cover (IC) to support a coil and stainless steel rod (magnet bearing surface), stationary permanent magnets (SPM) at the top and bottom, an oscillating permanent magnet (OPM), a base (B) to attach to a vibration shaker, and a magnetostrictive cap (MC) material at the top and bottom. In embodiments, energy is harvested by two mechanisms: (1) from the magnetostrictive top and bottom cap which induces voltage in the surrounding secondary coil due to the Villari effect, and (2) from the levitating permanent magnet which moves within the cavity and induces current in the primary coil given by Faraday's principle.

More specifically, FIG. 1 provides a multimodal energy harvester 100 comprising:
(a) an inductive mode 110 comprising:
  a cylindrical tube (IC) (111) with opposing ends,
  a rod (112) disposed lengthwise within the tube (111),
  a first permanent magnet (SPM) (113) with a first polarity disposed at one end of the cylindrical tube (111) and an second permanent magnet (SPM) (113) with a second polarity opposite the first polarity disposed at the opposing end of the tube (111),
  a central, annular oscillatory magnet (OPM) (114) disposed within the tube (111), between first and second permanent magnets (113), and around the rod (112); and
  a primary coil (PC) (115) disposed around an exterior of the cylindrical tube (111) and surrounding a portion of the central magnet (114), such that during use relative movement between the oscillatory magnet (114) and the primary coil (115) induces an electrical current in the primary coil (115); and
(b) a magnetostrictive mode (120) comprising:
  at least one piezoelectric cymbal transducer (121) disposed on one end of the cylindrical tube (111) and comprising a magnetostrictive material (shown in FIG. 2) surrounded by a secondary coil (SC) (122), such that during use movement of the magnetostrictive material induces voltage in the secondary coil (122).

The outer housing is optional and can be made of any material that protects the inner components of the device from external, especially environmental, factors. When installed in the device, the outer housing encompasses the primary and secondary coils as well as the oscillating permanent magnet (OPM) and magnet bearing surface. In embodiments, the outer housing can encompass the magnetostrictive caps (MC) as well. The base (B) is also optional and may be omitted in applications where it is desired to have the energy harvesting device replace a battery in an existing battery housing. Where the energy harvester is intended to be a stand-alone device, the base is shaped and sized to support the energy harvester in an upright manner, or otherwise functional manner, during use. The base can also comprise means for attaching the base to a support structure. Here, screw holes are provided to enable fixing of the energy harvester to the surface of a vibration source.

Another support structure illustrated in this example is the inner cover (IC). The inner cover is a housing for the magnet bearing surface (steel rod), the stationary permanent magnets (SPM), and the oscillating permanent magnet (OPM), as well as a support for the coils. In embodiments, the coils (primary and secondary) are disposed on an outer surface of the inner cover. Although the shape of the inner cover and outer housing is not critical, a preferred shape is cylindrical to mimic that of an AA battery.

Here, the inner cover is a hollow cylinder. Within the hollow cylinder, a first permanent magnet is disposed at one elongated end of the cylinder, while a second permanent magnet is disposed at the opposing elongated end of the hollow cylinder. The first and second permanent magnets are stationary, or fixed at either end of the cylinder.

An oscillatory magnet is also disposed within the hollow cylinder between the first and second permanent magnets. In embodiments, this oscillatory magnet may be referred to as a center or central magnet. The terms center and central are used in a non-limiting way and are meant to refer to the position of the oscillatory magnet relative to the permanent magnets. In embodiments, the oscillatory magnet may be centrally disposed between the permanent magnets, however, this is not a requirement. The oscillatory magnet is disposed within the cylinder in such a manner as to allow for levitation of the magnet during use. Preferably, the center magnet is annular and is disposed on a rod to guide levitation of the center magnet during use. In one embodiment, the rod is disposed loosely within the hole of the annular shaped oscillatory magnet to allow for longitudinal movement up and down the rod during use. In preferred embodiments, the rod extends the length of the hollow cylinder from one permanent magnet to the other. The outer housing, base, and inner cover can be made of any material, but plastics or other non-conductive material are preferred.

The primary and secondary coils comprise conductive wire, preferably copper. The conductive wire is of a gauge that allows for the wire to be wrapped around the external surface of the inner cover any number of times needed to achieve a particular effect. In embodiments, the copper wire is wrapped from 5-1000 times around the inner cover. The number of turns of the wire is not critical, however, in preferred embodiments the wire can be wound from 10-600 times, or from 20-500 times, or from 30-400 times, or from 50-200 times, or from 100-750 times, or from 300-900 times and so on. The diameter or gauge of the wire is also not critical, however, in preferred embodiments the wire is about 10-500 µm, such as about 20-400 µm, or about 30-300 µm, such as 50-200 µm, such as 60-100 µm, and most preferably from about 35-80 µm, such as about 40 µm. During use, vibration of the energy harvester will cause the oscillating magnet (e.g., the center magnet) to move within the primary coil thereby generating an output electrical current in the primary coil, which can be used to power remote sensor devices. Alternatively or additionally, the energy can be harnessed to charge a battery or other long term storage device.

Options for center magnet geometries are available, with two such geometries discussed in detail in this specification. The first embodiment consists of a single oscillating magnet in the center of the cylindrical shaft. The second embodiment consists of a center magnet as a composite of two magnets with opposite poles separated by a soft magnetic metal (steel). These designs have been fabricated and experimentally characterized by previous researchers. See C. R. Saha, T. O'Donnell, N. Wang, and P. McCloskey, Sens. Actuators A. 147 (2008). It was shown that the center magnet composite generated magnetic fields that were twice as strong as the single center magnet of same total volume. Thus, the center magnet composite is preferred for the inductive part of the harvester design of invention.

In summary, a preferred embodiment of the inductive mode of the MMEHs according to the invention include: a cylindrical tube with opposing ends, a rod disposed lengthwise within the tube, a first permanent magnet with a first polarity disposed at one end of the cylindrical tube and an second permanent magnet with a second polarity opposite the first polarity disposed at the opposing end of the cylindrical tube, a central, annular oscillatory magnet disposed within the tube, between the first and second permanent magnets, and around the rod; and a primary coil disposed around an exterior of the cylindrical tube and surrounding a portion of the central magnet, such that during use relative movement between the oscillatory magnet and the primary coil induces an electrical current in the primary coil.

In addition to the inductive mode of the energy harvester, the magnetostrictive mode can also generate useable energy. The magnetostrictive mode comprises one or more magnetostrictive caps disposed on opposing ends of the inner cover. In this embodiment, there is a first magnetostrictive cap disposed at the first end of the hollow cylinder and a second magnetostrictive cap disposed at the opposing elongated end of the hollow cylinder. Optionally, the magnetostrictive caps can be held in place by the outer cover and thus are disposed between the outer housing and the hollow cylinder inner cover. The magnetostrictive caps comprise a magnetostrictive material, which is surrounded or encompassed by a conductive coil. During use and when the energy harvester is subjected to vibration, movement in the magnetostrictive material of the cap(s) generates an output electrical current in the secondary coil. The energy generated from the magnetostrictive mode can be harnessed from the secondary coil either separately or preferably in parallel with the energy generated from the inductive mode, and then used for similar purposes.

Figure 2:
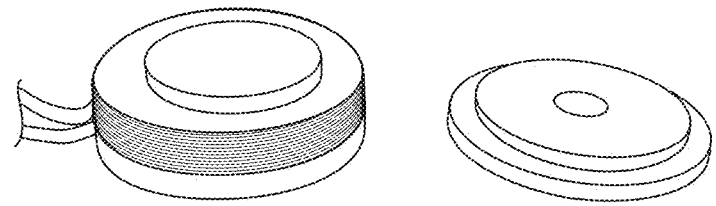
FIG. 2 is a schematic diagram showing a Galfenol clamp with no pre-stress.
Figure 3A:
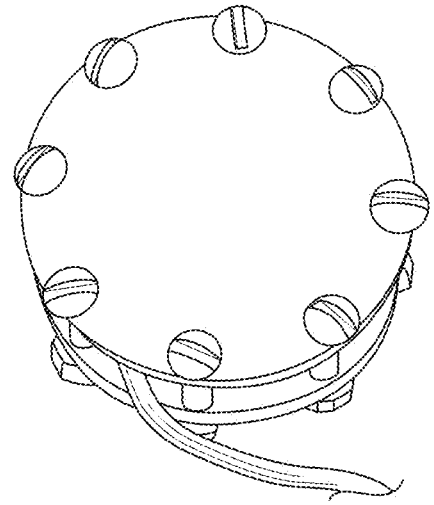
FIG. 3A is a schematic diagram showing a top perspective view of a Galfenol clamp with pre-stress capability.
Figure 3B:
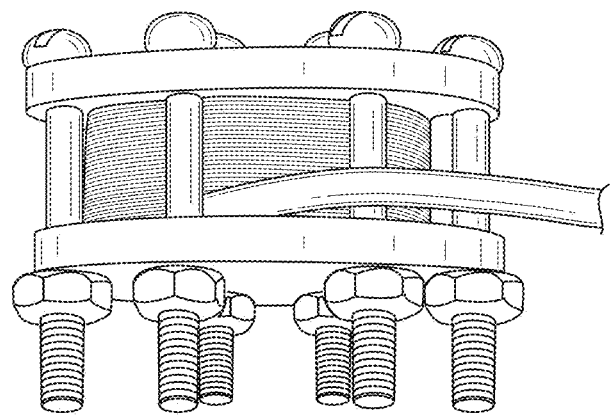
FIG. 3B is a schematic diagram showing a side perspective view of a Galfenol clamp with pre-stress capability.

As with the inductive portion of the device, there exist options for the magnetostrictive cap geometries that can be used according to embodiments of the present invention. FIGS. 2, 3A, and 3B show details of the design of both caps. In both embodiments, the Galfenol discs are clamped along the circumference, allowing deflection of the center unclamped part of the disc when external vibration is applied. The diameter of the Galfenol disc is preferably about 10 mm and the diameter of the free or non-clamped surface is 7.5 mm. In embodiments, the diameter of the Galfenol disc is typically between 6 mm and 20 mm, for example, while the diameter of the free or non-clamped surface is typically between about 2 mm and 15 mm. The actual size of the components is not critical, however, the unclamped portion of the disk may range from 30-95% of the diameter of the clamped portion, such as about 90%, 80%, 70%, 60%, 50%, 40%, etc. In preferred embodiments, a substantial portion of the diameter of the disk is unclamped to provide for sufficient movement of the unclamped portion during use.

The main difference between these two magnetostrictive cap examples lies in the clamping mechanism. As shown in FIG. 2, the Galfenol disc sits within a cap surrounded by the secondary coil. The cap was placed on the top and bottom of the inner cover shown in FIG. 1 and held rigidly in place by the outer cover. In FIG. 3A, the disc sits within a secondary coil ring, but is pre-stressed by securing two aluminum clamps with 80-80 stainless steel screws and nuts. It has been shown in a previous study that pre-stress increases magnetostriction and that an optimum pre-stress level exists. See J.-H. Yoo, G. Pelligrini, et al, Smart Mater. and Struct. 20(7) (2011). The magnitude of the pre-stress applied to the Galfenol depends on the amount of tension within the bolts. Here, the bolts were tightened with a Wiha Tools Torque Vario-S micro torque wrench range of 0.1-0.6 N-m. Any amount of desired tension can be used in embodiments of the system, including from between 0 and 2 N-m. Preferably, tension in the cap ranges from about 0.2-10 N-m, such as from 0.3-5 N-m, or from 0.4-2 N-m, or 0.5-1 N-m.

The applied torque is related to applied total stress by Eqs. (1-4) below. See R. J. Budynas and J. K. Nisbett, Shigley's Mech. Eng. Des. $8^{th}$ Ed (2008).

$$T_n = KF_n d \qquad (1)$$

$$T_n = \frac{K\sigma_{total} A_{total} d}{N} \qquad (2)$$

$$\tan\lambda = \frac{l}{\pi d_m} \qquad (3)$$

$$K = \left(\frac{d_m}{2d}\right)\left(\frac{\tan\lambda + f\sec\alpha}{1 - f\tan\lambda\sec\alpha}\right) + 0.625 f_c \qquad (4)$$

where $T_n$ is torque applied to each bolt, $F_n$ is tension within each bolt, d is diameter of bolt, N is number of bolts, $d_m$ is the mean diameter, $\lambda$ is the lead angle, f is the coefficient of friction, $\alpha$ is half of the thread angle. In one embodiment, the clamped Galfenol is then placed on the top and bottom of the inner tube and held in place by the outer cover.

In summary, preferred embodiments of MMEHs of the invention include a magnetostrictive mode including: a piezoelectric cymbal transducer disposed on one end of a cylindrical tube and comprising a magnetostrictive material surrounded by a secondary coil, such that movement of the magnetostrictive material induces voltage in the secondary coil.

In order to theoretically determine the output power of harvester, the dynamics of center magnet and the magnetic field distribution within the harvester was determined. The dynamics of the oscillating magnet were modeled by using a nonlinear spring-mass-damper mechanical system with an external applied base excitation given as:

$$m\ddot{z}(t) + c_m \dot{z}(t) + kz(t) + k_3 z(t)^3 + k_5 z(t)^5 = -m\ddot{y}(t) - mg \qquad (5)$$

where m is a vibrating mass, $c_m$ is the mechanical damping constant, k is the linear stiffness constant of the spring, $k_3$ and $k_5$ are the nonlinear stiffness constants of the spring, $\ddot{z}(t)$ is the relative acceleration between the base of the structure and the vibrating mass, g is the gravitational constant and $\ddot{y}(t)$ is the base acceleration. In linear systems, gravity is normally canceled by the static equilibrium with the spring, but due to the nonlinear stiffness constants gravitational force is included. In the context of this specification, in the mechanical system, the mass refers to mass of the center magnet or composite. The stiffness refers to the stiffness created by the repulsive force exerted on the center magnet by the top/bottom permanent magnets. The mass for the system was determined from magnet density and geometry. The stiffness constants for the system were approximated using the following nonlinear relationship:

$$F = kx + k_3 x^3 + k_5 x^5 \qquad (6)$$

where F is the repulsive force exerted by the outer magnets on the center magnet, x is the displacement of the center magnet composite, and k is the linear stiffness constant, and $k_3$ and $k_5$ are the non-linear stiffness constants. In order to estimate the repulsive force as a function of center magnet displacement, extensive computational simulations using ANSYS magnetics package were performed. The analysis was executed by using Solid 236 elements for magnets, air, soft magnetic material (steel).

Figure 4:
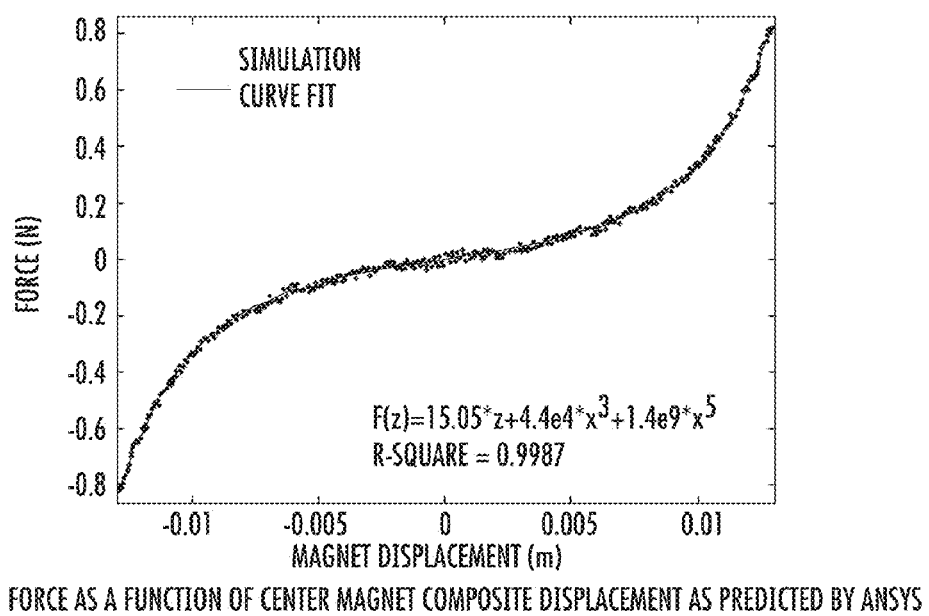
FIG. 4 is a graph showing force as a function of center magnet composite displacement as predicted by ANSYS.

FIG. 4 shows the variation in net force on center magnet (repulsive force) as a function of center magnet composite displacement. In order to approximate the stiffness terms, the computational data was fitted with a $5^{th}$ order non-linear curve as described by Eq. 6 shown in FIG. 4. From this curve fit the constants were determined to k=15.05 N/m and $k_3=4.371e^4$ N/m$^3$ and $k_5=1.439e^9$ N/m$^5$. The last term defining the mechanical system is the mechanical damping constant $c_m$. The mechanical damping constant is a function of other system parameters given as:

$$c_m = 2\zeta_m \sqrt{km} \qquad (7)$$

where k is the stiffness, m is the mass, and $\zeta_m$ is mechanical damping ratio. The damping ratio can only be determined experimentally. The damping ratio for the system was determined by applying an initial displacement and measuring the amplitude of the decay of this displacement to the neutral position. The displacement was measured with a Polytec laser vibrometer (Model OFV3001). Assuming a linear variation, the envelope of the amplitude decay can be modeled with the following relationship shown in Eq. 8. See Y. Tadesse, S. Zhang, and S. Priya, J. Int. Mater. Syst. Struct. 20 (2009).

$$\ln\left|\frac{A_0}{A_n}\right| = \frac{2\pi n \zeta}{\sqrt{(1-\zeta^2)}} \qquad (8)$$

where $A_0$ is the first amplitude of motion, n is the decaying cycle and $\zeta_m$ is the damping ratio. In embodiments, the damping ratio was calculated to 0.0994.

After modeling the dynamics the distribution of the magnetic fields within the harvesters was determined to determine the effect the electrical system has on the system dynamics and to predict voltage and power output. When under an electrical load the harvester dynamics change, due to the added electrical damping force. This force opposed the motion of the center magnet and is governed by the following equation:

$$\vec{F} = I\vec{L} \times \vec{B} \qquad (9)$$

From Eq. 9 it is determined that this force F is dependent on the magnitude of current flow I due to the coil length and magnetic field B remaining constant. The magnitude of current flow is determined by the following equation:

$$I = \frac{BLv}{(R_e + R_L)} \qquad (10)$$

From the Eq. 10 the current is shown to be dependent upon the velocity v as the coil resistance $R_e$, load resistance $R_L$ magnetic field B, and coil length L are constant. Therefore the electrical damping constant can be derived from the following relationship:

$$F = BLI = BL\frac{(Blv)}{R} = \frac{(Bl)^2}{(R_e+R_L)}v = c_e v \qquad (11)$$

The electrical damping force is only applied when the magnet is within the coil volume. Due to large range of motion of the center magnet as compared to the thin region of coil, this additional damping term cannot be applied for all x(t). A piecewise function was added to Eq. 5 to incorporate the additional damping effect only when the center magnet passes through the coil. In order to predict the power output, Eq. 5 is numerically solved for velocity ż using the ode 45 solver in MATLAB 7.12.0 (R2011a) and applying Kirchoff's Voltage Law to the magnetic circuit.

$$U = Bl\dot{z} - R_e i \qquad (12)$$

$$U = \frac{Bl\dot{z}}{R_L + R_e} R_L \qquad (13)$$

$$P = \left(\frac{Bl\dot{z}}{R_L + R_e}\right)^2 R_L \qquad (14)$$

where the quantity ż represents the relative displacement of the center magnet with respect to coil, $R_L$ is the load resistance, B is the magnetic field, l is the length of coil, $R_e$ is the coil resistance. The coil inductance was not included in the modeling of the electrical system. It has been stated in research that inductance in electromagnetic harvesters operating at low frequencies (<1 kHz) can be neglected. See T. O'Donnell, C. Saha, S. Beeby, and J. Tudor, Microsyst. Technol. 13 (2007); see also K. Nakano, S. Elliott, and E. Rustighi, Smart Mater. Struct. 16 (2007). Every quantity is determined except for the quantity Bl which is referred to as the transformation factor Φ for the rest of the analysis. In order to estimate the transformation factor Φ, the distribution of the magnetic field is spatially determined, and the coil length is discretized using an experimentally verified approach by the following researchers. See A. Marin, S. Bressers, et al, J. of Phys. D: Appl. Phys. 44(29) (2011); see also J. M. Oliver and S. Priya, J. Intell. Mater. Syst. Struct. 21 (2009); see also A. Marin, et al, J. of Intell. Mater. (Submitted). The transformation factor Φ which governs rotational energy to electrical energy conversion is determined through the relationship:

$$U_e = -\int (\vec{z} \times \vec{B}) \cdot d\vec{l} \cong \dot{z}\Phi \qquad (15)$$

where $\vec{z}$ is the relative velocity between center magnet and coil, $\vec{B}$ is the magnetic field cutting the coil, is the conductor length. By assuming that the coil velocity is orthogonal to magnetic field vectors, the line integral in Eq. (15) reduces to Eq. (16):

$$U_e = -\dot{z}\int_0^{L_{coil}} B(r) dl \qquad (16)$$

By discretizing the coil volume, Eq. (16) is reduced to Eq. (17) as:

$$\Phi \cong \Sigma B(r) \Delta L_{coil}(r) \qquad (17)$$

$$\Delta L_{coil}(r) = \frac{L_{coil}}{\# \text{ of volumes}} \qquad (18)$$

Figure 5:
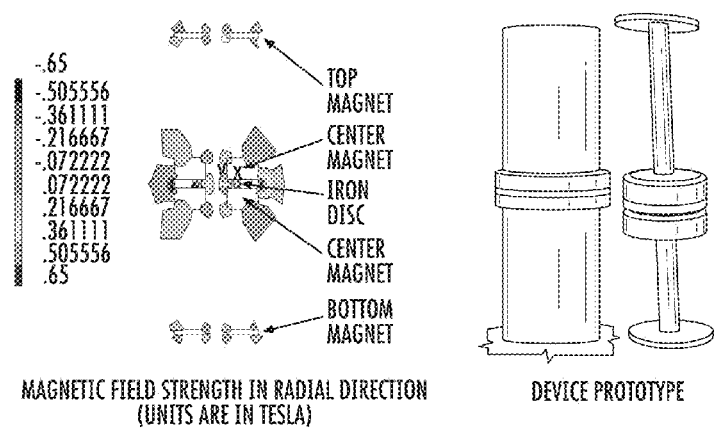
FIG. 5A is a schematic diagram illustrating the magnetic field strength in radial direction (magnetic field strength units are in Tesla).
FIG. 5B is a schematic diagram showing an embodiment of a device according to the invention corresponding with the diagram in FIG. 5A.

To model the radial variation in magnetic field strength B(r) simulations were run using ANSYS electromagnetics. Solid 96 elements were used to model the magnetic circuit. FIG. 5A shows the distribution of magnetic fields within the harvester.

Figure 6:
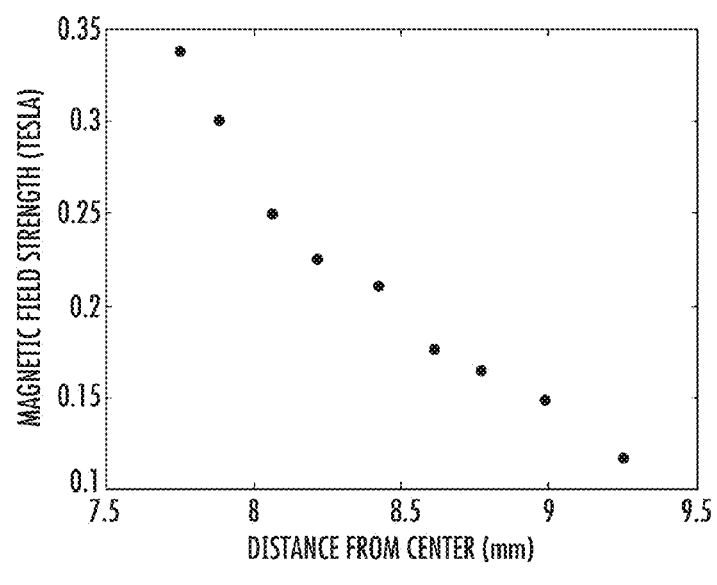
FIG. 6 is a graph showing the magnetic field strength in the radial direction within the coil volume.

While FIG. 5A gives a spatial distribution of magnetic field for the entire prototype, the area of interest for predicting the voltage generation is located within the coil volume. FIG. 6 shows the radial variation of the magnetic field strength within the coil volume.

The change in coil length with respect to radius $\Delta L_{coil}(r)$ within the discretized volumes of coil was characterized with simple trigonometry equations. Eq. 17 is used to determine the transformation factor of 5.05 T-m. Revisiting Eq. 14 the power output can now be predicted for various accelerations and frequencies.

Figure 7:
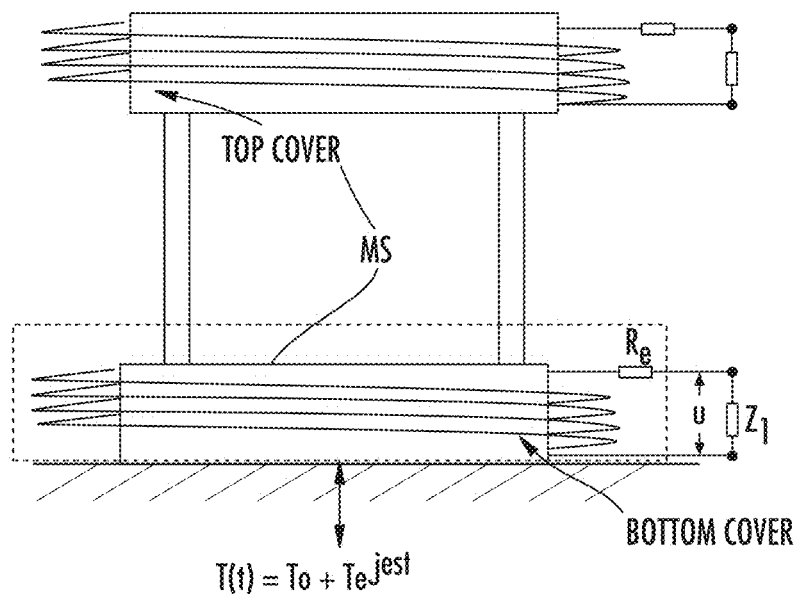
FIG. 7 is a schematic diagram illustrating a magnetostrictive energy harvester wherein current is induced in the surrounding pick-up coil.

In addition to the inductive analytical model, an analytical model for the magnetostrictive harvesting mechanism is presented based on an approach by Lundgren et al., and Zhao and Lord, and initial numerical simulations performed in a previous study. See X. Zhao and D. G. Lord, J. Appl. Phys. 99 (2006); see also A. Lundgren, H. Tiberg, L. Kvarnsjo, and A. Bergqvist, IEEE Trans. Magn. 29(6) (1993); see also A. Marin, Y. Tadesse, and S. Priya, Integ. Ferroelec. 125(1) (2011). The magnetostrictive material used in the top and bottom cap can harvest energy from vibration using the inverse magnetostrictive effect. This implies that under an applied stress or strain on the magnetostrictive material, the magnetic permeability changes resulting in change in the magnetic flux that can be converted into current by a pickup coil. A schematic diagram for the modeling of the magnetostrictive energy harvester structure is shown in FIG. 7. The top and bottom magnetostrictive coils were attached to load impedance $Z_1$. The applied stress from the base was assumed to be sinusoidal at frequency of w. To simplify the analysis, the cylindrical shell housing of the harvester was assumed to be rigid and the applied stress at the base was assumed to be transferred to the top and bottom cap.

The magnitude of the applied stress from the shaker during testing can be assumed to be the force applied per unit area on the magnetostrictive material due to inertia when the base vibrates at an acceleration a. Practically, the input force form the shaker is higher to accelerate the body attached to the end of the shaker and overcome the resistances imposed on the system. Therefore, the input force can be taken as the inertial force which can be easily obtained by measuring the input acceleration (from sensor) and the mass of the overall device.

$$T = \frac{m_T a}{A} = \frac{m_T (xg)}{A} \tag{19}$$

where $m_T$ is the total mass of the harvester, a is the base acceleration, x is a amplitude of acceleration relative to gravitational acceleration g and A is the cross-sectional area of the magnetostrictive cap. The equivalent inductance of the coil surrounding the magnetostrictive discs can be given as:

$$L_c = \frac{\mu_0 n^2 A_L}{l}, \tag{20}$$

where $$A_L = \pi D(r_0 + D/3)$$

where $\mu_0$ is the permittivity of free space, is the number of winding, l is the length of the wire, D is the thickness of the coil, and $r_0$ is the coil inner diameter. When stress is applied to the magnetostrictive disc, the magnetic flux density through the discs changes inducing change in electric field. As a result, eddy current flows around the disc axis. The eddy current coefficient can be obtained from. See X. Zhao and D. G. Lord, J. Appl. Phys. 99 (2006).

$$\chi = \frac{2 J_1 \left( r_0 \sqrt{-j\omega\mu^T \sigma} \right)}{r_0 \sqrt{-j\omega\mu^T \sigma} \, J_0 \left( r_0 \sqrt{-j\omega\mu^T \sigma} \right)} \tag{21}$$

where $J_0$ and $J_1$ are the zero and first order Bessel functions of the first kind, $\sigma$ is the conductivity, $\mu^T$ is the magnetic permeability at constant stress, $\omega$ is the frequency.

Considering the resistance of coil ($R_e$) and the external load impedance ($Z_1$) as serially connected as shown in FIG. 7 the total impedance of the magnetostrictive circuit can be written as: $Z_0 = Z_1 + R_c$. The voltage across the magnetostrictive disc was derived by Zhao and Lord as:

$$u = \frac{j\omega n l A Z_0 \left(\frac{d^*}{d}\right)}{\left(\frac{1}{d\chi}\right)(Z_0 + j\omega L_c)l + j\omega n^2 A \left(\frac{\mu^T}{d}\right)} T \tag{22}$$

where u is the voltage across the coil surrounding the magnetostrictive disc, d is the magnetostrictive coefficient, and d' is the conjugate of d. See X. Zhao and D. G. Lord, J. Appl. Phys. 99 (2006). By principle of voltage division between the impedances, the voltage at the load resistor is given as:

$$u_1 = \frac{Z_1}{(Z_1 + R_c)} u \tag{23}$$

Finally, the electrical output power across an impedance load $Z_1$ is estimated from:

$$P_e = \frac{|u_1|^2}{Z_1} \tag{24}$$

The impedance was assumed to be purely resistive, i.e. $Z_1 = R_L$.

Figure 8:
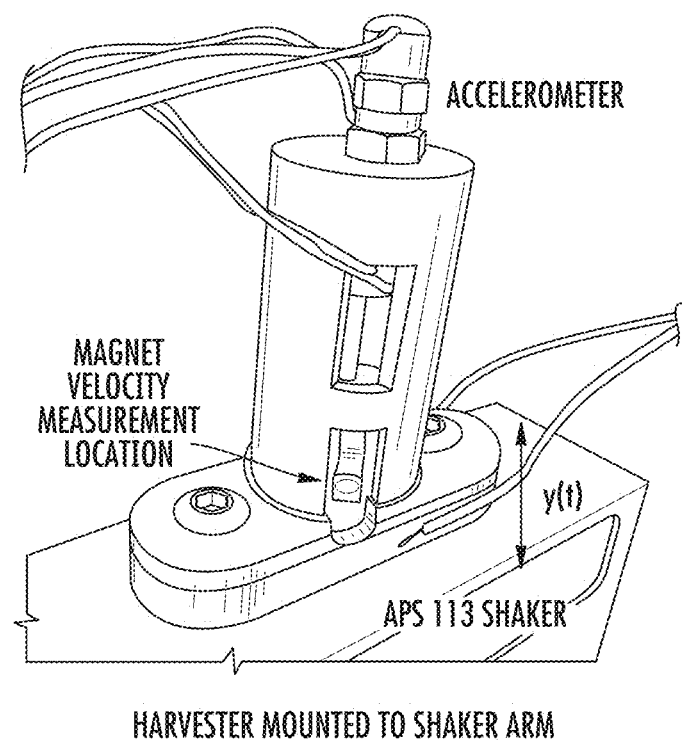
FIG. 8 is a schematic diagram showing an embodiment of the present invention as a harvester mounted to a shaker arm (vibration source).
Figure 9A:
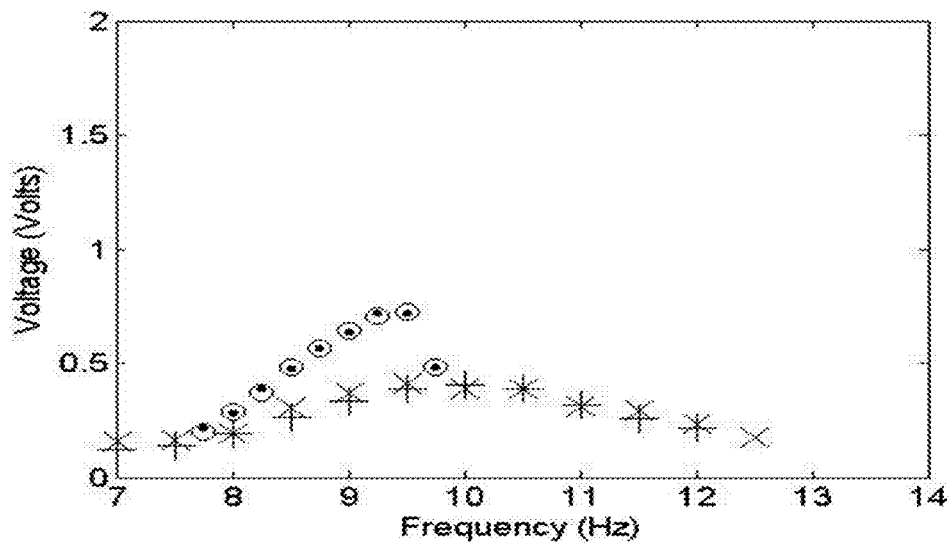
FIG. 9A is a graph showing the Voltage vs. Frequency for 0.4 G base acceleration.
Figure 9B:
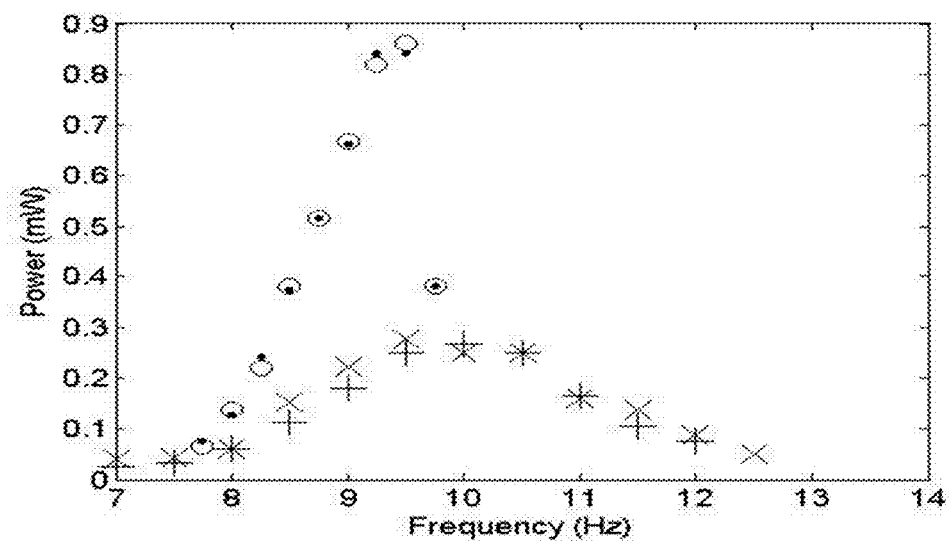
FIG. 9B is a graph showing the Power vs. Frequency for 0.4 G base acceleration.
Figure 9C:
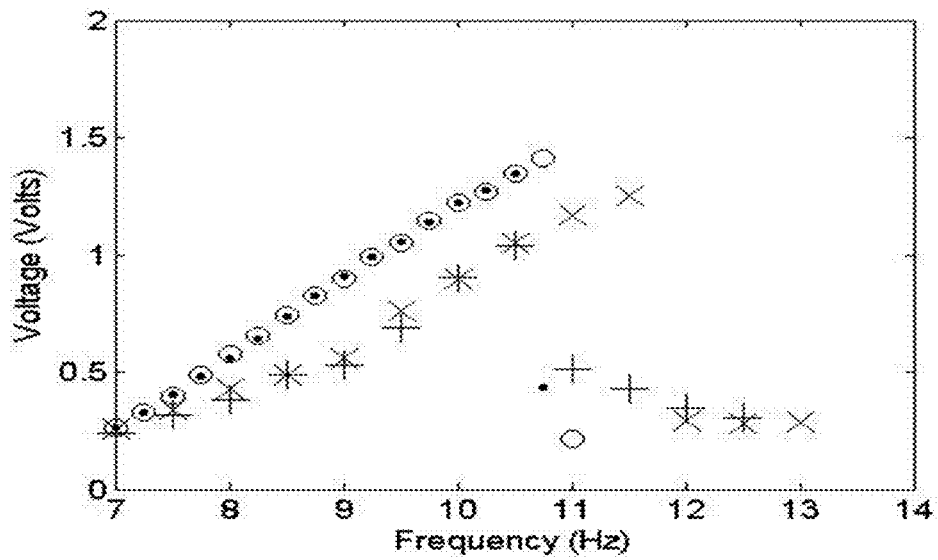
FIG. 9C is a graph showing the Voltage vs. Frequency for 0.7 G base acceleration.
Figure 9D:
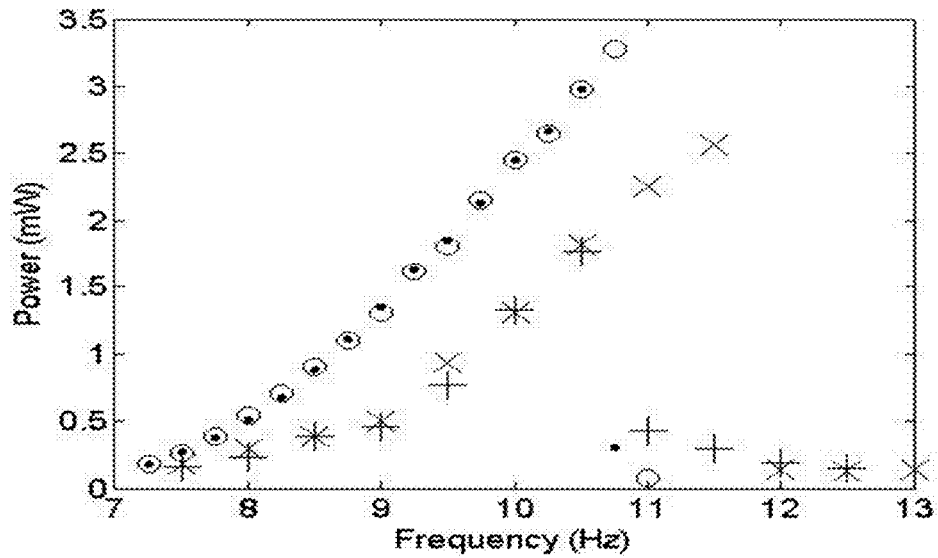
FIG. 9D is a graph showing the Power vs. Frequency for 0.7 G base acceleration.
Figure 9E:
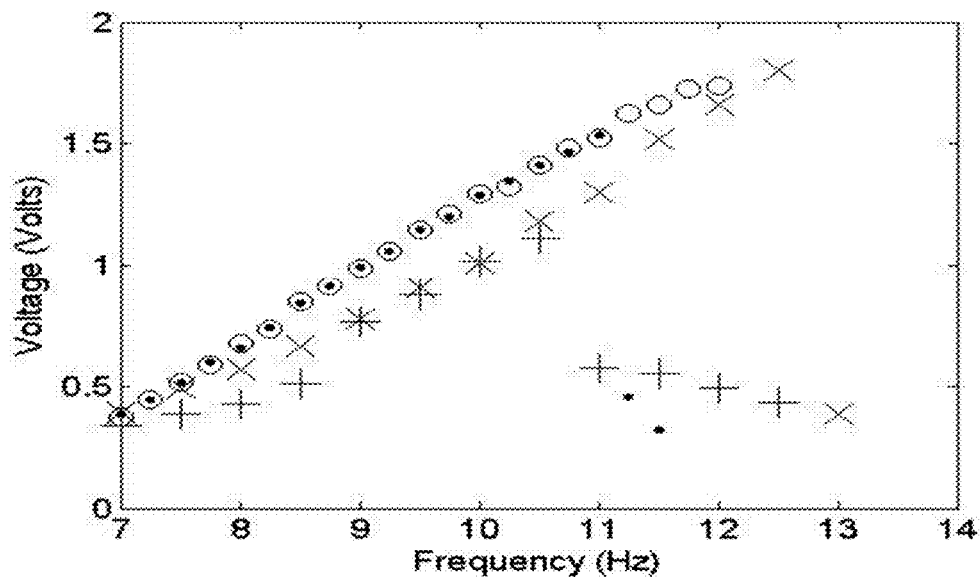
FIG. 9E is a graph showing the Voltage vs. Frequency for 0.9 G base acceleration.
Figure 9F:
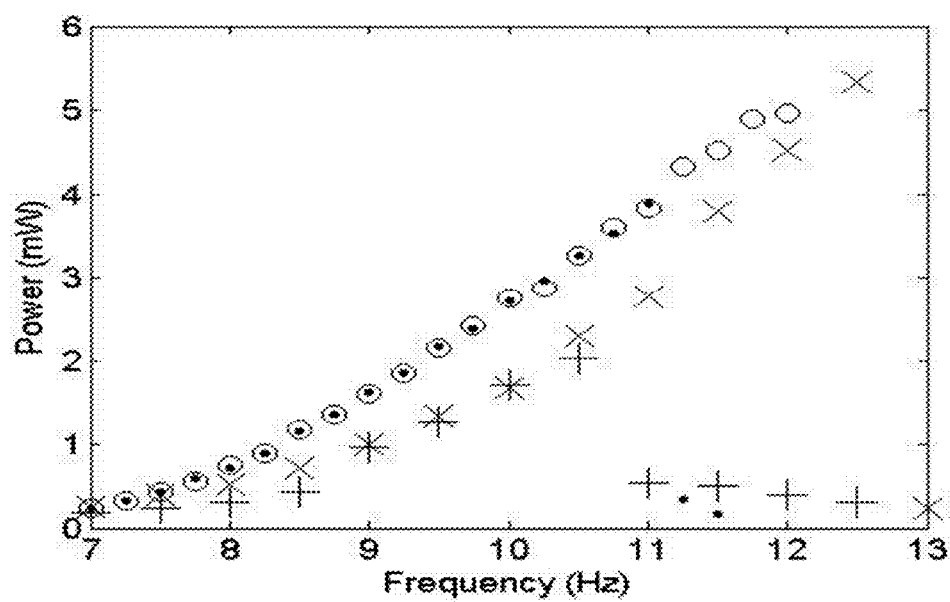
FIG. 9F is a graph showing the Power vs. Frequency for 0.9 G base acceleration.

To demonstrate the effectiveness of embodiments of the energy harvester of the invention, the energy harvesting system shown in FIG. 8 was tested. Generally, the base of the energy harvester was mounted to a vibration source, i.e., on the arm of a seismic shaker (Acoustic Power Systems 113). Acceleration was measured on the top of the outer cover, as shown in FIG. 8, using an accelerometer (Piezotronics Inc.). The output signal from the accelerometer was conditioned using a signal conditioner (Piezotronics Inc.). The velocity of the center magnet was measured using a digital vibrometer (Polytec OFV 353). More specifically, an L-shaped plastic bar which protrudes outside the outer cover is attached to the center magnet composite in order to measure the velocity. Since the weight of the bar was small compared to the weight of the center magnet composite, significant influence from the bar on center magnet dynamics was not expected. An analog-to-digital converter, for example, Spectral Dynamics Siglab A/D converter, controlled with a MATLAB graphical user interface was used to generate input signals to the seismic shaker to create vibration and also to capture the output signals from the accelerometer and the vibrometer. Three sets of leads provide access to the inductive coil and top and bottom magnetostrictive coils. Voltage generated by the harvester was measured by placing a load resistor in series with the individual coil(s). The RMS voltage was measured by using a digital multimeter.

The analytical models presented earlier were used to simulate the electrodynamics and power generated by the inductive (electromagnetic) and magnetostrictive mechanisms. Below, the simulations are then compared to the experimental results to validate the models.

The following parameters and associated values applied in the inductive simulations using Eqs. (12-14) and used in the fabrication of the prototype are listed in Table I.

TABLE I

| Parameters | Values |
| --- | --- |
| Cylinder (mm) | 50 long × 16 OD |
| Center Magnet (mm) | 12.7 OD × 3.2 ID × 3.2 THK |
| End Magnet (mm) | 12.7 OD × 3.2 ID × 0.8 THK |
| Soft Magnetic (mm) | 12.7 OD × 3.2 ID × 1.2 THK |
| Mechanical Mass (g) | 6.53 |
| Stiffness, k (N/m) | 15.05 |
| Stiffness, $k_3$ (N/m$^3$) | 4.37E+04 |
| Stiffness, $k_5$ (N/m$^5$) | 1.44E+09 |
| Damping ratio, $\zeta_m$ | 0.0994 |
| Coil Size (mm) | 15.5 ID × 18.5 OD × 1 THK |
| Coil Length (m) | 25.2 |
| Coil Resistance (ohms) | 348 |
| Wire Diameter (micron) | 40 |
| Φ (T*m) | 5.05 |

OD = outside diameter, ID = inside diameter, THK = thickness

To investigate the bandwidth and dynamic response of the harvester frequency, response functions between base velocity and center magnet composite velocity were simulated within the 7 Hz-18.5 Hz range. The frequency response functions were generated for three different base accelerations to determine the effect of acceleration on bandwidth and power, 0.4 G, 0.7 G and 0.9 G. Forward and backward frequency sweeps were applied to capture the influence from the jump phenomena on the frequency response function caused by the nonlinear stiffness relationship. This is a common effect seen in nonlinear mechanical systems. See B. P. Mann and N. D. Sims, J. of Sound and Vibr. 319 (2009); see also M. J. Brennan, I. Kovacic, et al., J. of Sound and Vibr. 318(4-5) (2008). Voltage predictions are calculated from velocity predictions using (Eq. 13) and compared to the measured voltage rather than comparing simulated and experimental velocity directly. The velocity could not be measured for the full range of base amplitudes due to coil volume limiting the range of motion of the L-shaped lip which is attached to the center magnet composite as shown in FIG. 8.

FIGS. 9A-F show the results of the simulation compared with experimental results for the specified geometry in Table I for 0.4 G, 0.7 G and 0.9 G base excitation magnitudes. The circles in the graphs represent simulated forward sweeps, the dots represent simulated backward sweeps, the X's represent experimental forward sweeps, and the + symbols represent experimental backward frequency sweeps. The inductive mechanism generated 5.3 mW, 2.57 mW, 0.27 mW at 0.9 G, 0.7 G and 0.4 G respectively. The model agrees with experimental data better at the higher base excitation than the low excitation magnitudes. The discrepancy was attributed to the following causes. The coil is positioned at the center of the top and bottom magnets. Due to the force of gravity, the equilibrium for the center magnet composite is not at the center of the top and bottom magnets, it is 3.8 mm lower. For the simulations it was assumed that when the center of the magnet passes the center of the coil this velocity stays constant through the thickness of the coil occurs and any velocity gradient in the thickness direction of the coil was neglected. This would be true for systems where the coil is positioned at the equilibrium position, but due to the equilibrium being lower than coil position it is possible that the gradient cannot be neglected. Another assumption that was made was the damping constant was assumed to linear through the full range of center magnet composite displacement. The damping was measured by displacing the magnet by 10 mm from equilibrium position and measuring the decay back to equilibrium, therefore for lower base accelerations where the magnet may never reach of maximum displacement of 10 mm the damping constant may vary.

To compare this system to the state of the art for energy harvesters operating below 20 Hz a volume figure of merit and a bandwidth figure of merit can be calculated:

$$F_0 M_v = \frac{\text{Useful Power Output}}{\frac{1}{2} Y_0 \rho_{AU} Vol^{\frac{4}{3}} \omega^3}$$

$$F_0 M_{BW} = F_0 M_v \times \frac{BW_{3db}}{\omega}$$

Figure 10:
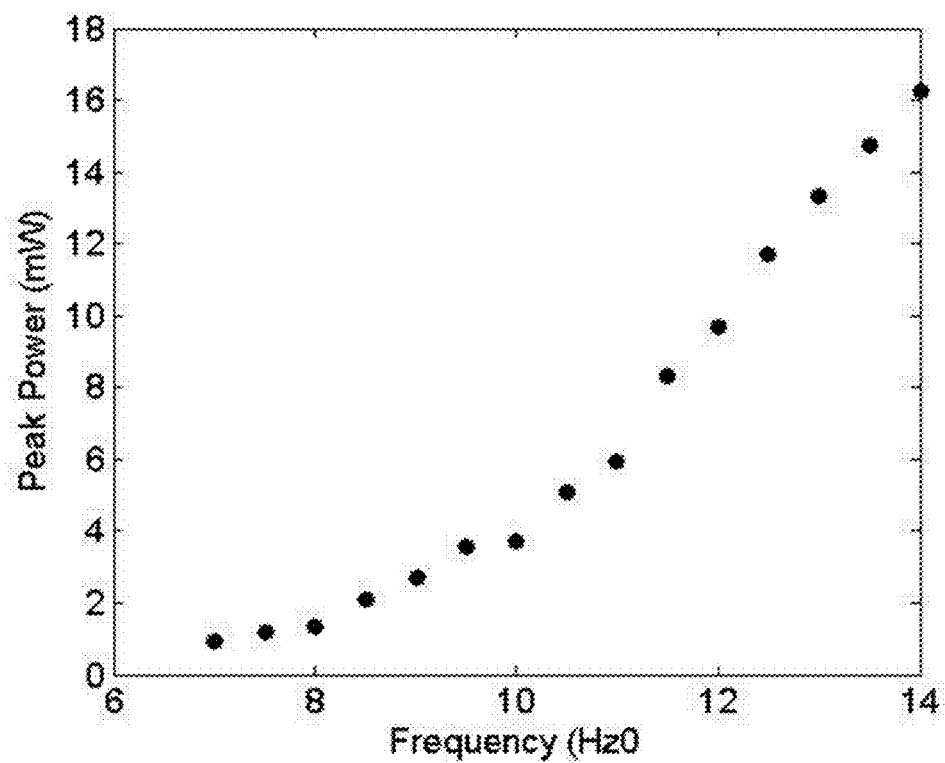
FIG. 10 is a graph of the frequency response function for 1 G base excitation.

See P. D. Micheson, E. M. Yeatman, et al, Proc. of the IEEE 96(9) (2008). More particularly, this system is being compared with the Galchev et al. system, which has been proclaimed as the state of the art, and which is characterized by having a volume figure of merit of 0.074% and bandwidth figure of merit of 0.375%. See T. Galchev, K. Hanseup, et al, J. of Microelectromech. Syst. 20(4) (2011). An attempt was made to confirm these calculations, however, and according to Mitcheson et al. a discrepancy existed. The corrected volume figure of merit according to formulation in Mitcheson et al. was 0.0157% and bandwidth figure of merit of 0.00837%. This was calculated using the total volume, peak power, acceleration, and resonant frequency listed within the study published by Galchev et al. The volume figure of merit and bandwidth figure of merit calculated by the same method for the embodiment of the invention tested was 0.0598% and 0.0107% respectively, suggesting the inductive portion of the inventive system is state of the art for harvesters operating below 20 Hz. It should be noted that at the lower acceleration level the nonlinearity is not present in the frequency response function due to damping limiting the range of motion of the center magnet composite as seen in FIGS. 9A-F. Therefore at the lower acceleration levels the bandwidth figure of merit could decrease. FIG. 10 displays the 1 G experimental data used for the calculations.

The following parameters and associated values that were applied in the magnetostrictive simulations using Eq. (19)-(24) and used in the fabrication of the system of the invention tested are listed in Table II.

TABLE II

Simulation parameters of magnetostrictive energy harvester.

| Parameters | Values |
| --- | --- |
| Magnetic permeability at constant stress for Galfenol | $\mu^T = 290\mu_0, \mu_0 = 4\pi 10^{-7}$ |
| Conductivity of Galfenol | $\sigma = 2.15 \times 10^6$ [S/m] |
| Magnetostrictive coefficient Galfenol | d = 4.2e−8 [m/A] |
| Outside diameter of end magnet | Dom = 12.7e−3 [m] |
| Outside diameter of end magnet | Dim = 3.2e−3[m] |
| Thickness of end magnet | tm1 = 3.2e−3 [m] |
| Thickness of bottom magnet | tm2 = 0.8e−3 [m] |
| Density of magnet | denM = 8.5e3[kg/m$^3$] |
| Total mass of the harvester (including magnets, magnetostrictive caps, coil and housing) | $m_T$ = 30.2*, 42.2** [gm] |

TABLE II-continued

Simulation parameters of magnetostrictive energy harvester.

| Parameters | Values |
| --- | --- |
| Thickness of magnetostrictive Cap (Galfenol) | $T_G = 2$ [mm] |
| Diameter of magnetostrictive Cap (Galfenol) | $D_G = 10$ [mm] |
| Density of Galfenol | $\rho_G = 7.6$ [gm/cm$^3$] |
| Coil size | 12.37 ID × 14.63 OD × 1.5 THK (mm) |
| Wire diameter | 40 [µm] |
| Number of turns | 608 |
| Resistivity of coil | 1.68e−8(Ω m) |
| Coil resistance with Prestress | $R_c$ = 336*, 847** |
| Coil length (m) without Prestress | 24.3*, 61.4** |

*Values taken for with Prestress experiment and simulations
**Values taken for without Prestress experiment and simulations The magnetostrictive mechanism was characterized with three different levels of bias (1.99 kA/m, 3.58 kA/m and 6.05 kA/m) in an effort to determine if an optimum magnetic bias existed. The optimum magnetic bias exists where the slope is max on the magnetostriction vs applied magnetic field curve, providing the most change in the magnetic permeability of the material for a given strain. Three acceleration levels were applied to the prototype (0.2 G, 0.6 G and 1 G) at each bias level to determine optimum bias dependency upon base acceleration. Frequency sweeps from 0 Hz to 200 Hz were applied to capture the effect of frequency on voltage output. Before performing the above characterization the load resistance was also varied to determine if an optimum load resistance existed. It was found that bias had minimal effect on optimum load resistance and an optimum load resistance of 800 was determined. An optimum bias of 3.58 kA/m was found suggesting that more energy can be harvested at this level than the other bias levels and this bias level was independent of base acceleration and frequency.

To determine the effect on voltage generation, four different pre-stress levels (0 MPa, 38.8 MPa, 64.7 MPa, 77.7 MPa) were applied using the new cap structure. The bias level was also altered to determine the dependence on pre-stress and it was found that the optimum bias remained the same, therefore 3.58kA/m was used for the pre-stress characterization. An optimum pre-stress level of 38.8 MPa existed. The difference in magnitude can be explained by difference in number of turns and optimum load between the two cap geometries. The cap without pre-stress capability had 949 turns and optimum load of 800 ohms and the cap with pre-stress capability had 608 turns and optimum load of 300 ohms. The outer diameter between the two caps needed to be the same therefore in order to insert the screws for the cap with pre-stress capability the coil outer radius was decreased.

Numerical simulations were performed based on the Eq. (19)-(24) presented in the magnetostrictive modeling section and parameters listed in Table II, to predict the output voltage and power. The applied pre-stress affects the magnetic permeability of the magnetostrictive material. To effectively utilize the Eqs. (21-22), the magnetic permeability has to be found as a function of stress in a separate testing. Since the permeability changes as the stress is applied, multiplying coefficients were used to fit the experimental power output of the magnetostrictive part. In this graph, the input base acceleration was 1G, operating frequency f=200 Hz, winding wire copper (wire diameter 40 µm, resistivity=1.68e-8 Ωm, length of wire=24.3 m) and all the other values used for the simulations are tabulated in table II. The $\mu^T$ which was taken from reference is multiplied by 0.33 to take in to account the change in stress. This value was obtained by iteration to fit the experimental values. At high pre-stress level (77.7 MPa) the value of $\mu^T$=290*0.33 $\mu_o$=95.7 $\mu_o$ provides a good agreement with the experimental values. The peak power in both the experimental and theoretical case occur at around 300Ω, and the power consistently decreases as the resistance is increased further.

Numerical simulations were also performed to observe the power output as the frequency of operation changes. The power versus resistance load in which the peak power values were observed around 300Ω. The model shows that the power increases as the operating frequency increase from 0-500 Hz for all load resistances. This was due to the size of the Galfenol disc which was clamped at the edge and did not reach resonance level. In other words, the resonance frequency is much higher than the one simulated.

Experimental and theoretical values of the power output of magnetostrictive cap without prestress are also performed and the power is in order of 0.06 µW and the load resistance that provided the highest power is ~800Ω. The magnetic biases, varied in the experimental case, have slight difference in power output and the simulated values follow similar trend to the experimental. In the case where no stress is applied on the Galfenol cap (without prestress), the resistance of the coil and the inertial mass is different than the pre-stressed test results presented before. The values used in the simulation are shown in Table II. The magnetic permeability in this case is also varied since stress is not applied on the Galfenol. The values used for simulations is $\mu^T$=290*0.02 $\mu_o$=5.8 $\mu_o$ to account the change in permeability due to stress.

The power output of the magnetostrictive part without pre-stress applied on the cap were simulated for various values of frequencies. The effect of the stress applied was included in the model by varying the magnetic permeability. This value was obtained by iteration. Therefore, similar conditions were used to simulate the power output as a function of frequency and load resistances.

The maximum power harvested using the magnetostrictive mechanism was ~0.06 µW. The low power output can be explained for a couple of reasons. The design of the magnetostrictive does not allow for significant strain given acceleration values at 1 G. If the thickness of the magnetostrictive disc was decreased from 2 mm to 200 microns more strain result from a given acceleration thus increasing the harvested power. Also due to the large thickness the resonance frequency is much higher than the frequencies for the applications discussed in this study. In order to achieve resonance at the low frequencies future improvements to the design could be arraying of multiple magnetostrictive cantilevers in a circular array at the tops and bottoms of the tube. These cantilevers could share a common tip mass (bottom or top magnet) which would deflect due to the magnetic force interaction with the center magnet as well as the inertial effects. The decrease in thickness of Galfenol and the geometry change should allow for more strain of Galfenol therefore increasing the energy harvesting capability.

The present invention provides a multi-mechanism energy harvester. The prototype harvests energy using both inductive and magnetostrictive mechanisms. The harvester was designed to attain AA-battery size and shape (see FIG. 1) which enhances the integration with existing wireless sensors in the field. The experimental results were compared to theoretical predictions for both mechanisms and showed reasonable agreement. The volume figure of merit and bandwidth figure of merit for the prototype is calculated as 0.0598% and 0.0107% respectively, verifying that the prototype is state of the art for harvesters operating below 20 Hz. The inductive mechanism generated 5.3 mW, 2.57 mW, 0.27 mW at 0.9 G, 0.7 G and 0.4 G respectively. The maximum power harvested using the magnetostrictive mechanism was ~0.06 µW.

The present invention has been described with reference to particular embodiments having various features. It will be apparent to those skilled in the art that various modifications and variations can be made in the practice of the present invention without departing from the scope or spirit of the invention. One skilled in the art will recognize that these features may be used singularly or in any combination based on the requirements and specifications of a given application or design. Other embodiments of the invention will be apparent to those skilled in the art from consideration of the specification and practice of the invention. Where a range of values is provided in this specification, each value between the upper and lower limits of that range is also specifically disclosed. The upper and lower limits of these smaller ranges may independently be included or excluded in the range as well. As used in this specification, the singular forms "a," "an," and "the" include plural referents unless the context clearly dictates otherwise. It is intended that the specification and examples be considered as exemplary in nature and that variations that do not depart from the essence of the invention are intended to be within the scope of the invention. Further, the references cited in this disclosure are incorporated by reference herein in their entireties.

The invention claimed is:

1. A multimodal energy harvester comprising:
   (a) an inductive mode comprising:
   a cylindrical tube with opposing ends,
   a rod disposed lengthwise within the tube,
   a first permanent magnet with a first polarity disposed at one end of the cylindrical tube and an second permanent magnet with a second polarity opposite the first polarity disposed at the opposing end of the cylindrical tube,
   a central, annular oscillatory magnet disposed within the tube, between the first and second permanent magnets, and around the rod; and
   a primary coil disposed around an exterior of the cylindrical tube and surrounding a portion of the central magnet, such that during use relative movement between the oscillatory magnet and the primary coil induces an electrical current in the primary coil; and
   (b) a magnetostrictive mode comprising:
   at least one piezoelectric cymbal transducer disposed on one end of the cylindrical tube and comprising a magnetostrictive material surrounded by a secondary coil, such that during use movement of the magnetostrictive material induces voltage in the secondary coil.

2. The energy harvester of claim 1 sized and shaped similar to an AA battery.

3. The energy harvester of claim 1 further comprising a protective housing configured to enclose the inductive and magnetostrictive modes.

4. The energy harvester of claim 1, wherein the oscillatory magnet is a single oscillating magnet.

5. The energy harvester of claim 1, wherein the oscillatory magnet is a composite of two magnets with opposite poles separated by a magnetic metal.

6. The energy harvester of claim 1, wherein during use the relative movement between the oscillatory magnet and the primary coil is caused by movement of the magnet.

7. The energy harvester of claim 1, wherein the magnetostrictive material is in a pre-stressed state.

8. The energy harvester of claim 1, wherein the magnetostrictive material is chosen from FeGa Alloy; $Tb_xDy_{1-x}Fe_2$; nickel-copper-zinc ferrite; and iron-nickel-phosphorus-boron alloy.

9. The energy harvester of claim 1, wherein the magnetostrictive mode comprises two piezoelectric cymbal transducers disposed at opposing ends of the cylindrical tube.

10. The energy harvester of claim 1, wherein the primary and secondary coils comprise copper wire.

11. The energy harvester of claim 1, which is a low frequency and broadband vibration energy harvester capable of harvesting energy from frequencies below about 20 Hz.

* * * * *